United States Patent
El-Hassan et al.

(10) Patent No.: US 10,778,345 B2
(45) Date of Patent: Sep. 15, 2020

(54) DYNAMIC LOOK UP TABLE MEASUREMENTS FOR TRANSMITTER WITH ENVELOPE TRACKING SYSTEMS

(71) Applicant: Apple Inc., Cupertino, CA (US)

(72) Inventors: Wassim El-Hassan, San Jose, CA (US); Mohammad Reza Ghajar, Santa Clara, CA (US); Gurusubrahmaniyan Subrahmaniyan Radhakrishnan, San Jose, CA (US); Vineet Nayak, Sunnyvale, CA (US); Srinivasa Yasasvy Sateesh Bhamidipati, Milpitas, CA (US)

(73) Assignee: Apple, Inc., Cupertino, CA (US)

( * ) Notice: Subject to any disclaimer, the term of this patent is extended or adjusted under 35 U.S.C. 154(b) by 0 days.

(21) Appl. No.: 15/862,279

(22) Filed: Jan. 4, 2018

(65) Prior Publication Data

US 2019/0081712 A1 Mar. 14, 2019

Related U.S. Application Data

(60) Provisional application No. 62/556,821, filed on Sep. 11, 2017.

(51) Int. Cl.
*H04B 17/13* (2015.01)
*H03F 3/24* (2006.01)
(Continued)

(52) U.S. Cl.
CPC ............ *H04B 17/13* (2015.01); *H03F 1/025* (2013.01); *H03F 1/3241* (2013.01); *H03F 3/24* (2013.01);
(Continued)

(58) Field of Classification Search
CPC ....... H04L 5/001; H04L 5/0053; H04L 4/001; H04L 5/0007; H04L 5/0064; H03F 2200/451; H03F 1/025; H03F 1/3241; H03F 3/24; H03F 3/245; H03F 2200/102; H04B 17/13; H04B 1/0475; H04B 2001/0408; H04B 2001/0416
See application file for complete search history.

(56) References Cited

U.S. PATENT DOCUMENTS

2011/0261776 A1* 10/2011 Ahn .................. H04L 5/0007
370/329
2016/0072530 A1* 3/2016 El-Hassan ............. H03F 1/0227
455/114.2

(Continued)

*Primary Examiner* — Sung S Ahn
(74) *Attorney, Agent, or Firm* — Fletcher Yoder, P.C.

(57) ABSTRACT

The representative embodiments discussed in the present disclosure relate to techniques in which the operating characteristics (e.g., gain and/or efficiency) of a power amplifier in a transmitter may be regulated according to an operation mode of the transmitter. More specifically, in some embodiments, different look-up tables (LUTs) may be employed for each mode of operation to suitably adjust the supply voltage to the power amplifier and modulate its operating characteristics based on power input to the power amplifier. Further, in some embodiments, a method to calibrate a LUT for uplink carrier aggregation (ULCA) operation mode of the transmitter may be employed to populate a LUT used to suitably adjust the supply voltage during ULCA.

16 Claims, 8 Drawing Sheets

(51) Int. Cl.
*H03F 1/02* (2006.01)
*H04B 1/04* (2006.01)
*H03F 1/32* (2006.01)
*H04L 5/00* (2006.01)

(52) U.S. Cl.
CPC ........... *H03F 3/245* (2013.01); *H04B 1/0475* (2013.01); *H04L 5/001* (2013.01); *H03F 2200/102* (2013.01); *H04B 2001/0408* (2013.01); *H04B 2001/0416* (2013.01); *H04L 5/0007* (2013.01); *H04L 5/0064* (2013.01)

(56) References Cited

U.S. PATENT DOCUMENTS

2016/0197627 A1* 7/2016 Qin ...................... H04B 1/0475
2018/0288697 A1* 10/2018 Camuffo ............... H04W 52/02

* cited by examiner

DYNAMIC LOOK UP TABLE MEASUREMENTS FOR TRANSMITTER WITH ENVELOPE TRACKING SYSTEMS

CROSS REFERENCE TO RELATED APPLICATIONS

The application is a Non-Provisional application claiming priority to U.S. Provisional Patent Application No. 62/556,821, entitled "Dynamic Look Up Table Measurements for Transmitter with Envelope Tracking Systems," filed Sep. 11, 2017, which is herein incorporated by reference.

BACKGROUND

The present disclosure relates generally to cellular and wireless devices and, more particularly, to cellular and wireless devices having transmitters capable of regulating the operating characteristics of a power amplifier corresponding to operating modes of the transmitter.

This section is intended to introduce the reader to various aspects of art that may be related to various aspects of the present disclosure, which are described and/or claimed below. This discussion is believed to be helpful in providing the reader with background information to facilitate a better understanding of the various aspects of the present disclosure. Accordingly, it should be understood that these statements are to be read in this light, and not as admissions of prior art.

Transmitters are commonly included in various electronic devices, and particularly, portable electronic devices such as, for example, phones (e.g., mobile and cellular phones, cordless phones, personal assistance devices), computers (e.g., laptops, tablet computers), internet connectivity routers (e.g., Wi-Fi routers or modems), radios, televisions, or any of various other stationary or handheld devices. Certain types of transmitters, known as wireless transmitters, may be used to generate wireless signals to be transmitted by way of an antenna coupled to a power amplifier in the transmitter. The power amplifier of the transmitter may apply a suitable gain to a signal to increase the signal's strength for better transmission over a channel (e.g., air). Further, the power amplifier may function at an optimum level of efficiency based on a power output of the power amplifier and a supply voltage used to power the power amplifier. As such, for a given power input to the power amplifier, there may exist a supply voltage that may result in the optimum level of efficiency and/or gain characteristics for the power amplifier. Thus, envelope tracking (ET) techniques may be used to track the amplitudes and shape of an input power signal so that the envelope of the supply voltage signal may be shaped to supply a suitable voltage level to the power amplifier at each amplitude of the input power signal's envelope. However, as transceivers become more complex and provide different modes of operation, it may be difficult to maintain optimum performance of the power amplifier.

SUMMARY

A summary of certain embodiments disclosed herein is set forth below. It should be understood that these aspects are presented merely to provide the reader with a brief summary of these certain embodiments and that these aspects are not intended to limit the scope of this disclosure. Indeed, this disclosure may encompass a variety of aspects that may not be set forth below.

As described in greater detail below, the transmitter may employ different modes of operation (e.g., normal operation and uplink carrier aggregation (ULCA)). A normal operation mode may be used to transmit a single baseband signal, having a narrow bandwidth, across a channel, while a ULCA mode may transmit multiple baseband signals aggregated into a single signal with a broader bandwidth. As such, ULCA may be used to transmit more information at once compared to the normal operation mode, and because of the differences between the two modes of operation and their transmitted signals, the power amplifier may operate differently in each mode of operation. To that end, the power amplifier may have desirable optimization conditions (i.e., voltage supply and power output) for each mode of operation in the transmitter. For example, during uplink carrier aggregation, in order to achieve a suitable adjacent channel leakage ratio (ACLR), the power amplifier may function in a linear region of its transfer function, or its iso-gain region. That is, to reduce distortion caused by the mixing (i.e., channel leakage) of the adjacent signals that are aggregated together in the ULCA transmitted signal, the power amplifier may apply constant gain to each power input. In the normal operation mode, however, the power amplifier may function in the non-linear region of its transfer function, or the constant compression region. That is, variable gain may be applied to the signal transmitted by the power amplifier in normal operation mode. To facilitate desirable functionality of the power amplifier, a distinct set of supply voltages mapped to power input levels may be utilized by each operation mode. Thus, a transmitter capable of suitably shaping the supply voltage of the power amplifier across multiple modes of operation may be desirable.

The representative embodiments discussed in the present disclosure relate to techniques in which the operating characteristics (e.g., gain and/or efficiency) of a power amplifier in a transmitter may be regulated according to an operation mode of the transmitter. More specifically, in some embodiments, different look up tables (LUTs) may be employed for each mode of operation to suitably adjust the supply voltage to the power amplifier and control its operating characteristics based on power input to the power amplifier. Further, in some embodiments, a method to calibrate a LUT for ULCA, an operation mode of the transmitter, may be employed to populate a LUT that may be used to suitably adjust the supply voltage during ULCA.

Various refinements of the features noted above may exist in relation to various aspects of the present disclosure. Further features may also be incorporated in these various aspects as well. These refinements and additional features may exist individually or in any combination. For instance, various features discussed below in relation to one or more of the illustrated embodiments may be incorporated into any of the above-described aspects of the present disclosure alone or in any combination. The brief summary presented above is intended only to familiarize the reader with certain aspects and contexts of embodiments of the present disclosure without limitation to the claimed subject matter.

BRIEF DESCRIPTION OF THE DRAWINGS

Various aspects of this disclosure may be better understood upon reading the following detailed description and upon reference to the drawings in which.

DETAILED DESCRIPTION

One or more specific embodiments of the present disclosure will be described below. These described embodiments are only examples of the presently disclosed techniques. Additionally, in an effort to provide a concise description of these embodiments, all features of an actual implementation may not be described in the specification. It should be appreciated that in the development of any such actual implementation, as in any engineering or design project, numerous implementation-specific decisions must be made to achieve the developers' specific goals, such as compliance with system-related and business-related constraints, which may vary from one implementation to another. Moreover, it should be appreciated that such a development effort might be complex and time consuming, but would nevertheless be a routine undertaking of design, fabrication, and manufacture for those of ordinary skill having the benefit of this disclosure.

When introducing elements of various embodiments of the present disclosure, the articles "a," "an," and "the" are intended to mean that there are one or more of the elements. The terms "comprising," "including," and "having" are intended to be inclusive and mean that there may be additional elements other than the listed elements. Additionally, it should be understood that references to "one embodiment" or "an embodiment" of the present disclosure are not intended to be interpreted as excluding the existence of additional embodiments that also incorporate the recited features.

A transmitter may employ different modes of operation to send a signal across a channel. For example, a normal operation mode may be used to transmit a single baseband signal, having a narrow bandwidth, across a channel, while a ULCA mode may transmit multiple baseband signals aggregated into a single signal with a broader bandwidth. Each of these and other modes of operation of the transmitter may impact the manner in which a power amplifier in the transmitter is employed (e.g., the gain and/or efficiency characteristics of the power amplifier). For example, a signal transmitted in ULCA mode may benefit from a power amplifier that has constant gain and decreased efficiency, while a signal transmitted in normal operation mode may benefit from a power amplifier with variable gain and increased efficiency.

To meet the desirable operation conditions of the power amplifier in each mode of operation of the transmitter, the supply voltage of the power amplifier may suitably be modified. In some embodiments, the supply voltage may adjust based on the envelope of an input signal in the transmitter. As such, envelope tracking may be employed in the transmitter to monitor the shape of the input signal. Further, in some embodiments, the adjustment made to the supply voltage based on the input signal's envelope may map to a different LUT based on the mode of operation of the transmitter. That is, the transmitter may include different LUTs for each of its modes of operation in order to suitably regulate the power amplifier and its operating characteristics.

As such, in order to apply constant gain in a power amplifier during ULCA mode, a LUT may be calibrated by determining suitable supply voltage levels to apply constant gain to each power input level at the power amplifier. Because the transfer function of an actual power amplifier, even in its most linear regions, may not be exactly linear (i.e., constant gain), the calibration of the LUT for ULCA mode may involve determining supply voltage levels that may linearize the transfer function of the power amplifier. In the case of a power amplifier with a linear transfer function (i.e., constant gain), a difference between two power input levels (ΔPin) may match the difference between their corresponding output levels (ΔPout). Thus, to determine the suitable supply voltages for the LUT calibration, a supply voltage suitable to cause ΔPin=ΔPout for each power input level may be determined.

Figure 1:
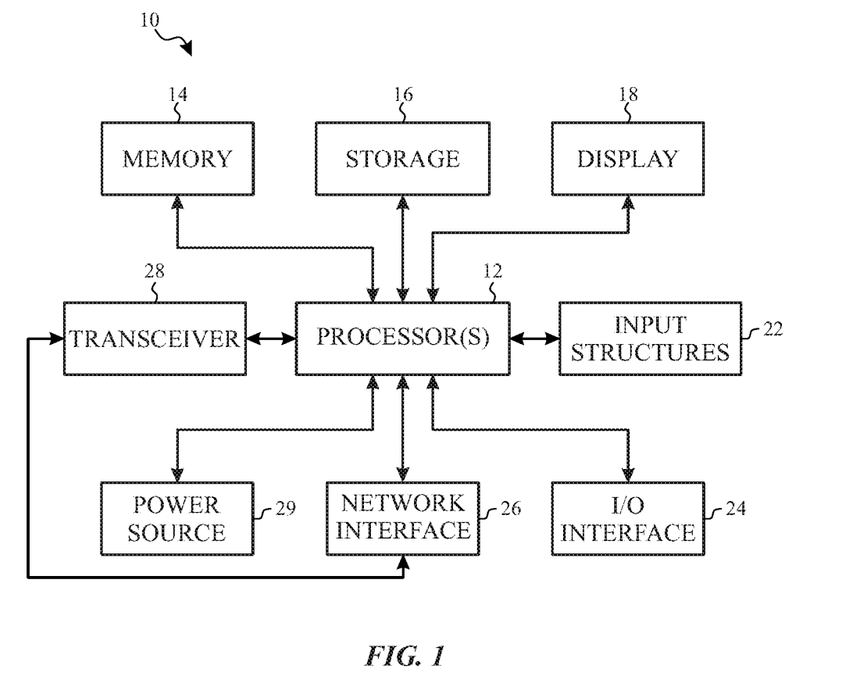
FIG. 1 is a schematic block diagram of an electronic device including a transceiver, in accordance with an embodiment.

With the foregoing in mind, a general description of suitable electronic devices that may employ a transmitter capable of suitably shaping a supply voltage of a power amplifier across multiple modes of operation will be provided below. Turning first to FIG. 1, an electronic device 10 according to an embodiment of the present disclosure may include, among other things, one or more processor(s) 12, memory 14, nonvolatile storage 16, a display 18, input structures 22, an input/output (I/O) interface 24, a network interface 26, a transceiver 28, and a power source 29. The various functional blocks shown in FIG. 1 may include hardware elements (including circuitry), software elements (including computer code stored on a computer-readable medium) or a combination of both hardware and software elements. It should be noted that FIG. 1 is merely one example of a particular implementation and is intended to illustrate the types of components that may be present in electronic device 10.

Figure 2:
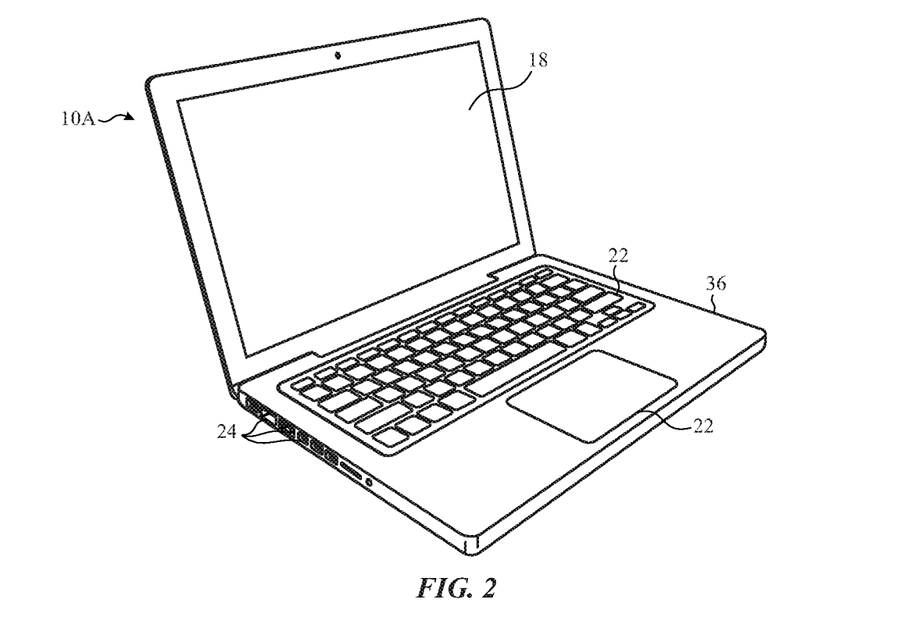
FIG. 2 is a perspective view of a notebook computer representing an embodiment of the electronic device of FIG. 1.
Figure 3:
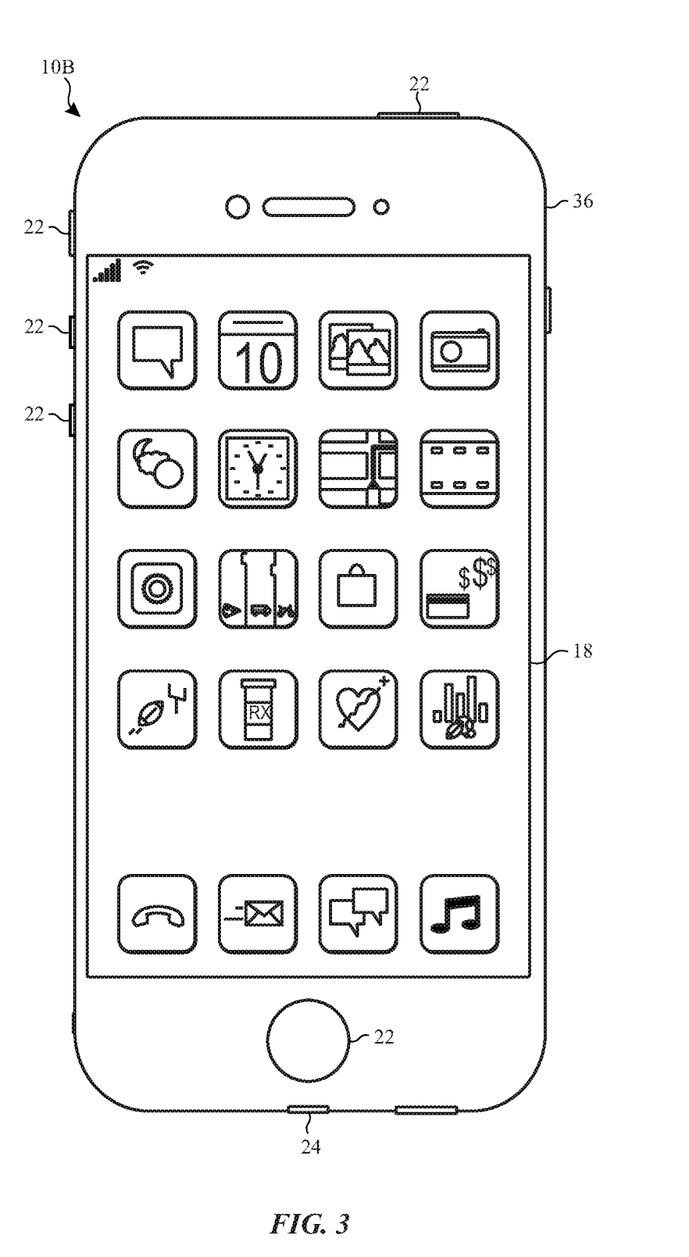
FIG. 3 is a front view of a hand-held device representing another embodiment of the electronic device of FIG. 1.
Figure 4:
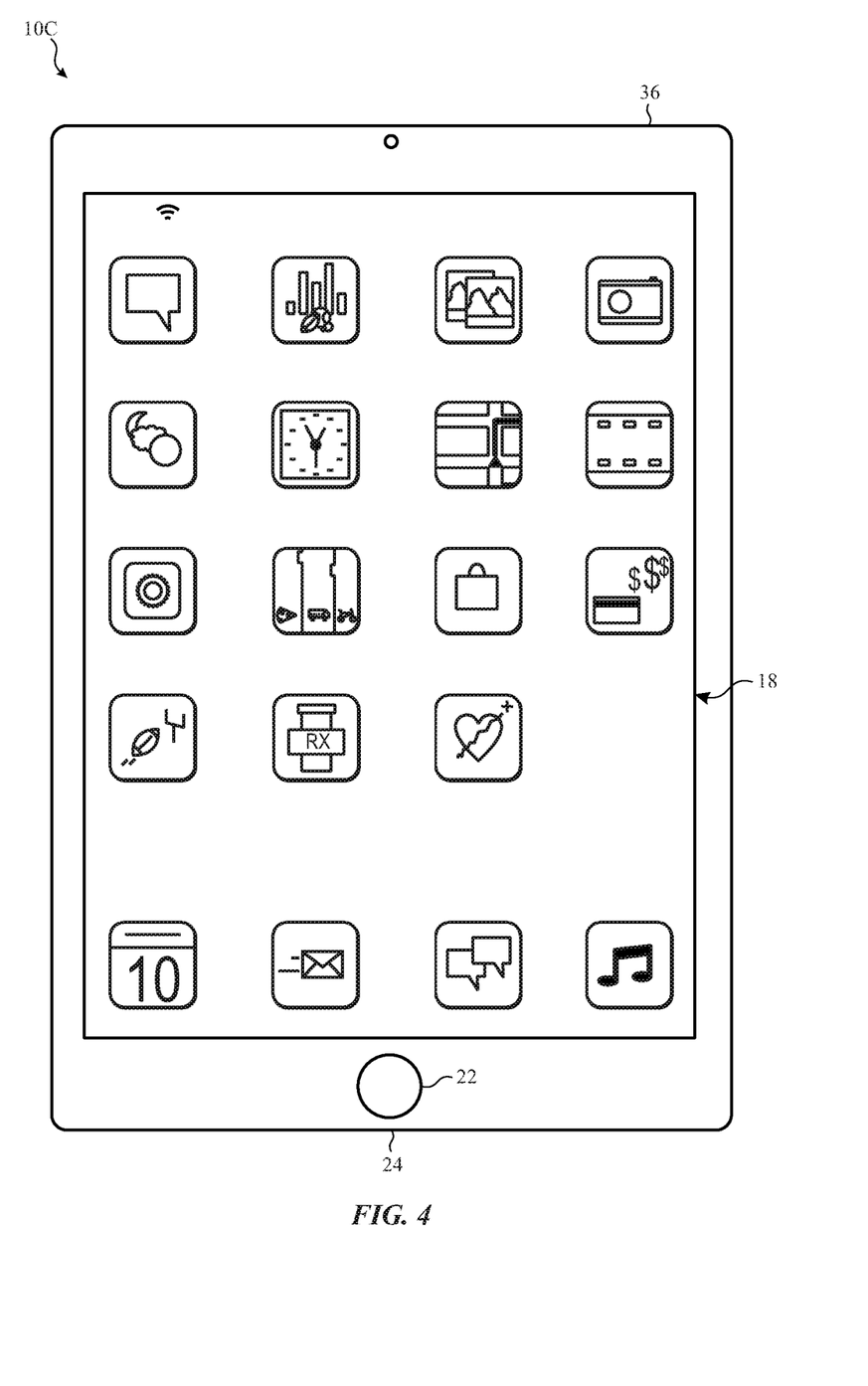
FIG. 4 is a front view of another hand-held device representing another embodiment of the electronic device of FIG. 1.
Figure 5:
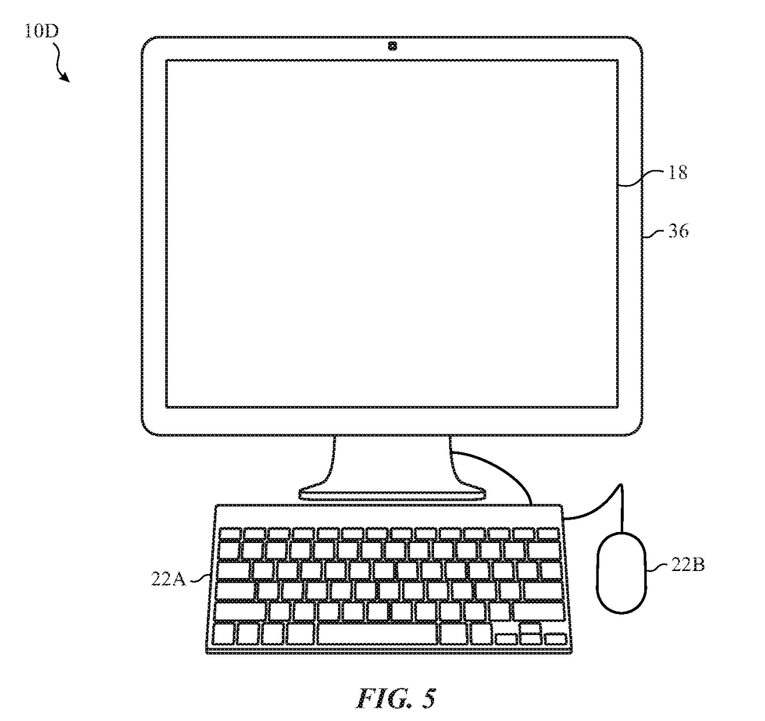
FIG. 5 is a front view of a desktop computer representing another embodiment of the electronic device of FIG. 1.
Figure 6:
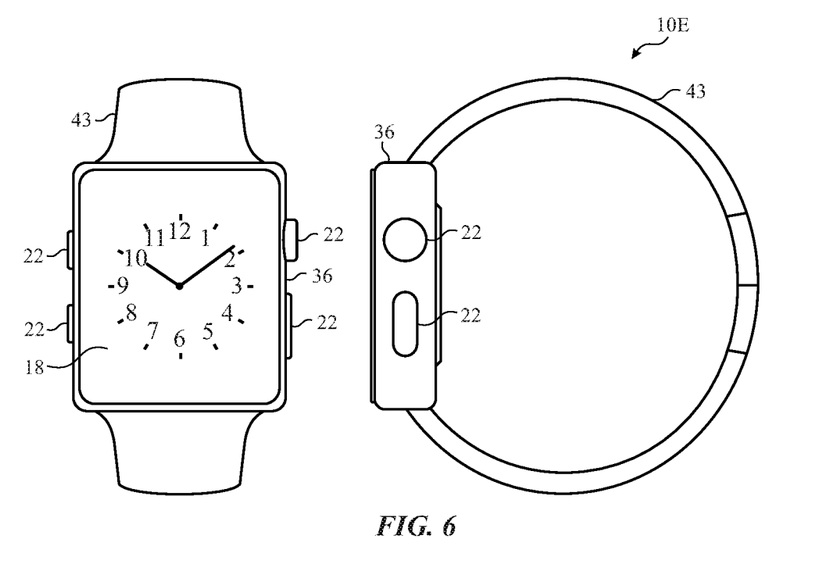
FIG. 6 is a front view and side view of a wearable electronic device representing another embodiment of the electronic device of FIG. 1.

By way of example, the electronic device 10 may represent a block diagram of the notebook computer depicted in FIG. 2, the handheld device depicted in FIG. 3, the handheld device depicted in FIG. 4, the desktop computer depicted in FIG. 5, the wearable electronic device depicted in FIG. 6, or similar devices. It should be noted that the processor(s) 12 and other related items in FIG. 1 may be generally referred to herein as "data processing circuitry." Such data processing circuitry may be embodied wholly or in part as software, firmware, hardware, or any combination thereof. Furthermore, the data processing circuitry may be a single contained processing module or may be incorporated wholly or partially within any of the other elements within the electronic device 10.

In the electronic device 10 of FIG. 1, the processor(s) 12 may be operably coupled with the memory 14 and the nonvolatile storage 16 to perform various algorithms. Such programs or instructions executed by the processor(s) 12 may be stored in any suitable article of manufacture that includes one or more tangible, computer-readable media at least collectively storing the instructions or routines, such as the memory 14 and the nonvolatile storage 16. The memory 14 and the nonvolatile storage 16 may include any suitable articles of manufacture for storing data and executable instructions, such as random-access memory, read-only memory, rewritable flash memory, hard drives, and optical discs. Also, programs (e.g., an operating system) encoded on such a computer program product may also include instructions that may be executed by the processor(s) 12 to enable the electronic device 10 to provide various functionalities.

In certain embodiments, the display 18 may be a liquid crystal display (LCD), which may allow users to view images generated on the electronic device 10. In some embodiments, the display 18 may include a touch screen, which may allow users to interact with a user interface of the electronic device 10. Furthermore, it should be appreciated that, in some embodiments, the display 18 may include one or more organic light emitting diode (OLED) displays, or some combination of LCD panels and OLED panels.

The input structures 22 of the electronic device 10 may enable a user to interact with the electronic device 10 (e.g., pressing a button to increase or decrease a volume level). The I/O interface 24 may enable electronic device 10 to interface with various other electronic devices, as may the network interface 26. The network interface 26 may include, for example, one or more interfaces for a personal area network (PAN), such as a Bluetooth network, for a local area network (LAN) or wireless local area network (WLAN), such as an 802.11x Wi-Fi network, and/or for a wide area network (WAN), such as a $3^{rd}$ generation (3G) cellular network, 4th generation (4G) cellular network, long term evolution (LTE) cellular network, long term evolution enhanced license assisted access (LTE-eLAA) cellular network, or long term evolution advanced (LTE-A) cellular network, which may involve ULCA. The network interface 26 may also include one or more interfaces for, for example, broadband fixed wireless access networks (WiMAX), mobile broadband Wireless networks (mobile WiMAX), asynchronous digital subscriber lines (e.g., ADSL, VDSL), digital video broadcasting-terrestrial (DVB-T) and its extension DVB Handheld (DVB-H), ultra Wideband (UWB), alternating current (AC) power lines, and so forth.

In certain embodiments, to allow the electronic device 10 to communicate over the aforementioned wireless networks (e.g., Wi-Fi, WiMAX, mobile WiMAX, 4G, LTE, and so forth), the electronic device 10 may include a transceiver 28. The transceiver 28 may include any circuitry the may be useful in both wirelessly receiving and wirelessly transmitting signals (e.g., data signals). Indeed, in some embodiments, as will be further appreciated, the transceiver 28 may include a transmitter and a receiver combined into a single unit, or, in other embodiments, the transceiver 28 may include a transmitter separate from the receiver. For example, the transceiver 28 may transmit and receive OFDM signals (e.g., OFDM data symbols) to support data communication in wireless applications such as, for example, PAN networks (e.g., Bluetooth), WLAN networks (e.g., 802.11x Wi-Fi), WAN networks (e.g., 3G, 4G, and LTE, LTE-eLAA, and LTE-A cellular networks), WiMAX networks, mobile WiMAX networks, ADSL and VDSL networks, DVB-T and DVB-H networks, UWB networks, and so forth. As further illustrated, the electronic device 10 may include a power source 29. The power source 29 may include any suitable source of power, such as a rechargeable lithium polymer (Li-poly) battery and/or an alternating current (AC) power converter.

In certain embodiments, the electronic device 10 may take the form of a computer, a portable electronic device, a wearable electronic device, or other type of electronic device. Such computers may include computers that are generally portable (such as laptop, notebook, and tablet computers) as well as computers that are generally used in one place (such as conventional desktop computers, workstations and/or servers). In certain embodiments, the electronic device 10 in the form of a computer may be a model of a MacBook®, MacBook® Pro, MacBook Air®, iMac®, Mac® mini, or Mac Pro® available from Apple Inc. By way of example, the electronic device 10, taking the form of a notebook computer 10A, is illustrated in FIG. 2 in accordance with one embodiment of the present disclosure. The depicted computer 10A may include a housing or enclosure 36, a display 18, input structures 22, and ports of an I/O interface 24. In one embodiment, the input structures 22 (such as a keyboard and/or touchpad) may be used to interact with the computer 10A, such as to start, control, or operate a GUI or applications running on computer 10A. For example, a keyboard and/or touchpad may allow a user to navigate a user interface or application interface displayed on display 18.

FIG. 3 depicts a front view of a handheld device 10B, which represents one embodiment of the electronic device 10. The handheld device 10B may represent, for example, a portable phone, a media player, a personal data organizer, a handheld game platform, or any combination of such devices. By way of example, the handheld device 10B may be a model of an iPod® or iPhone® available from Apple Inc. of Cupertino, Calif. The handheld device 10B may include an enclosure 36 to protect interior components from physical damage and to shield them from electromagnetic interference. The enclosure 36 may surround the display 18. The I/O interfaces 24 may open through the enclosure 36 and may include, for example, an I/O port for a hard wired connection for charging and/or content manipulation using a standard connector and protocol, such as the Lightning connector provided by Apple Inc., a universal service bus (USB), or other similar connector and protocol.

User input structures 22, in combination with the display 18, may allow a user to control the handheld device 10B. For example, the input structures 22 may activate or deactivate the handheld device 10B, navigate user interface to a home screen, a user-configurable application screen, and/or activate a voice-recognition feature of the handheld device 10B. Other input structures 22 may provide volume control, or may toggle between vibrate and ring modes. The input structures 22 may also include a microphone may obtain a user's voice for various voice-related features, and a speaker may enable audio playback and/or certain phone capabilities. The input structures 22 may also include a headphone input may provide a connection to external speakers and/or headphones.

FIG. 4 depicts a front view of another handheld device 10C, which represents another embodiment of the electronic device 10. The handheld device 10C may represent, for example, a tablet computer, or one of various portable computing devices. By way of example, the handheld device 10C may be a tablet-sized embodiment of the electronic device 10, which may be, for example, a model of an iPad® available from Apple Inc. of Cupertino, Calif.

Turning to FIG. 5, a computer 10D may represent another embodiment of the electronic device 10 of FIG. 1. The computer 10D may be any computer, such as a desktop computer, a server, or a notebook computer, but may also be a standalone media player or video gaming machine. By way of example, the computer 10D may be an iMac®, a Mac-Book®, or other similar device by Apple Inc. It should be noted that the computer 10D may also represent a personal computer (PC) by another manufacturer. A similar enclosure 36 may be provided to protect and enclose internal components of the computer 10D such as the display 18. In certain embodiments, a user of the computer 10D may interact with the computer 10D using various peripheral input devices, such as the keyboard 22A or mouse 22B (e.g., input structures 22), which may connect to the computer 10D.

Similarly, FIG. 6 depicts a wearable electronic device 10E representing another embodiment of the electronic device 10 of FIG. 1 that may be configured to operate using the techniques described herein. By way of example, the wearable electronic device 10E, which may include a wristband 43, may be an Apple Watch® by Apple, Inc. However, in other embodiments, the wearable electronic device 10E may include any wearable electronic device such as, for example, a wearable exercise monitoring device (e.g., pedometer, accelerometer, heart rate monitor), or other device by another manufacturer. The display 18 of the wearable electronic device 10E may include a touch screen display 18 (e.g., LCD, OLED display, active-matrix organic light emitting diode (AMOLED) display, and so forth), as well as input structures 22, which may allow users to interact with a user interface of the wearable electronic device 10E.

Figure 7:
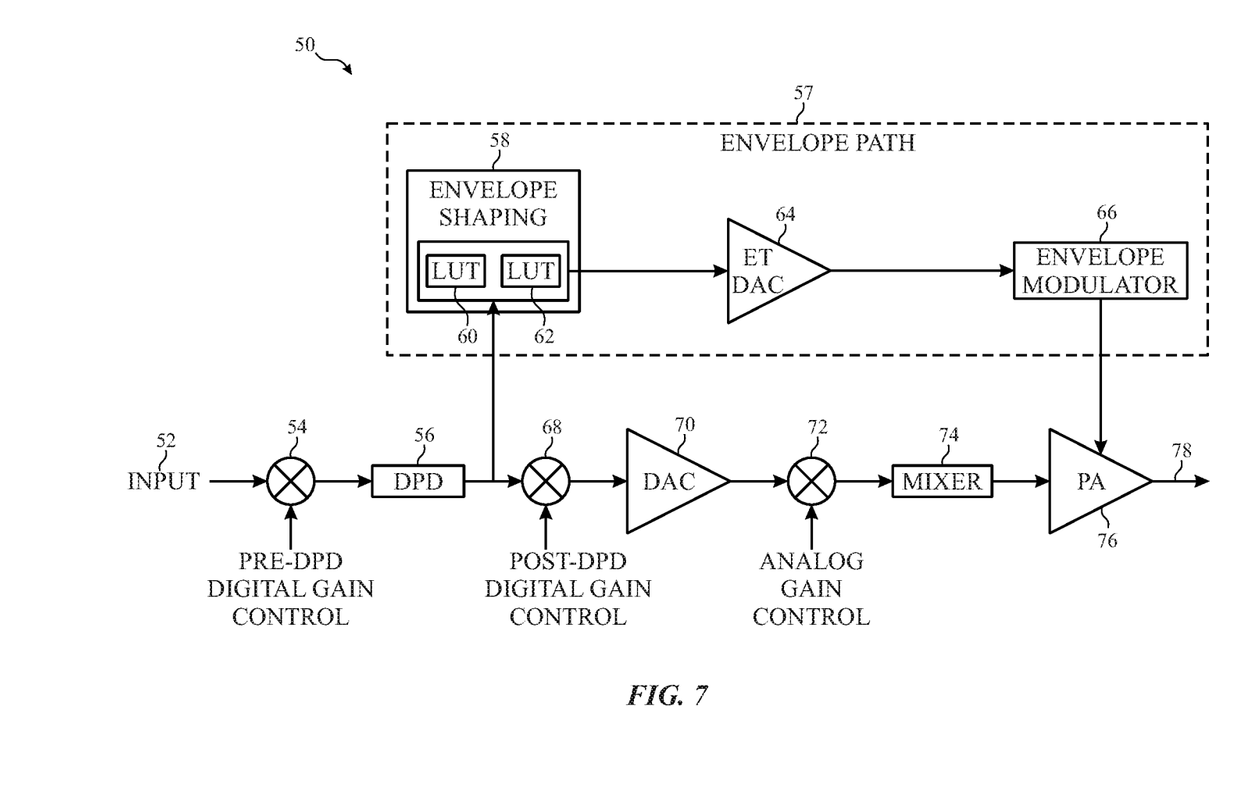
FIG. 7 is a schematic block diagram of an embodiment of the transceiver of FIG. 1 including a power amplifier.

As previously noted above, each embodiment (e.g., notebook computer 10A, handheld device 10B, handheld device 10C, computer 10D, and wearable electronic device 10E) of the electronic device 10 may include a transceiver 28. With the foregoing in mind, FIG. 7 depicts a schematic block diagram of an embodiment of a transmitter 50 within the transceiver 28. In the illustrated embodiment, the transmitter 50 is separate from the receiver within the transceiver 28, but in some embodiments, the transceiver 28 may include a transmitter 50 and a receiver combined into a single unit. Further, the various functional blocks shown in FIG. 7 may include hardware elements (including circuitry), software elements (including computer code stored on a computer-readable medium) or a combination of both hardware and software elements. It should also be noted that FIG. 7 is merely one example of a particular implementation and is intended to illustrate the types of components that may be present in the transmitter 50. As such, functional blocks may be added or omitted, and their arrangement within the transmitter 50 may be modified.

In some embodiments, the transmitter 50 may receive an input signal 52 that, after some modifications, may be transmitted wirelessly via an antenna (not shown) operably connected to an output 78 of the power amplifier (PA) 76. The input signal 52 and the modifications made to input signal 52 to prepare it for transmission may vary depending on an operation mode of the transmitter 50. In some embodiments, the operation modes of the transmitter 50 may include a normal operation mode and an uplink carrier aggregation mode (ULCA).

During the ULCA mode, the input signal 52 may include multiple component carriers, or baseband signals. That is, the input signal 52 may include several signals aggregated into one or more frequency bands. In some embodiments, for example, the input signal 52 may include two to five component carriers, each with a bandwidth of 20 MHz, aggregated contiguously into a signal with a single frequency band with a bandwidth of 40 MHz, 60 MHz, 80 MHz, or 100 MHz. In other embodiments, the input signal 52 may include a number of component carriers aggregated non-contiguously within the same frequency band and/or across a number of different frequency bands. Due to the nature of the input signal 52 in ULCA mode of the transmitter 50, the transmitter 50 may take certain precautions to transmit a more reliable signal. That is, the input signal 52 may be susceptible to a number of types of distortion whose effects may desirably be reduced by the transmitter 50. For example, the contiguously aggregated component carriers in the input signal 52 may be susceptible to mixing (i.e., adjacent channel leakage) due to their proximity to each other. Further, non-contiguously aggregated signals may suffer from intermodulation products. As such, to limit distortion and to meet requirements specified by the 3rd Generation Partnership Project (3GPP), such as adjacent channel leakage ratios, the transmitter 50 may implement techniques to hold the gain of the power amplifier 76 constant (i.e., iso-gain), as will be discussed in further detail.

In contrast, during normal operation mode, the input signal 52 may include a single baseband signal. Further, in some embodiments, the transmitter 50 may regulate the power amplifier 76 to apply variable gain to the input signal 52. More specifically, in such embodiments, the transmitter 50 may maintain the power amplifier 76 in a state of constant compression (i.e., gain compression) in which the gain applied to an input power signal is reduced compared to the gain applied to an input power signal within the constant gain operating region of the power amplifier 76. The use of constant compression in the power amplifier 76 during normal operation mode may improve the efficiency of the power amplifier, and the techniques the transmitter may implement to operate the power amplifier 76 in constant compression will be discussed in further detail.

Before transmission of a transmitted signal from the output 78 in either normal operation mode or ULCA mode, a pre-digital pre-distortion (pre-DPD) gain control 54 may apply a gain to the input signal 52. The pre-DPD gain control 54, as well as other gain control elements (i.e., post-DPD digital gain control 68 and analog gain control 72) in the transmitter 50 may apply gain to a signal so that the amplitude of an output signal of the gain control element is within a suitable operating range of the functional block that may receive the output signal of the gain control element as an input. As such, the digital pre-distortion (DPD) block 56 may apply distortion to the output of the pre-DPD gain control 54 to offset distortion the power amplifier 76 may introduce. That is, the DPD block 56 may introduce distortion intended to have the opposite effect on the signal compared to the distortion the power amplifier 76 may introduce. The output of the DPD block 56 may then have additional gain applied to it by a post-DPD digital gain control 68. A digital-to-analog converter (DAC) 70 may convert the output of the post-DPD digital gain control 68 from a digital to an analog signal to prepare the signal for transmission across an analog channel (e.g., air). An analog gain control 72 may apply an analog gain to the analog signal output from the DAC 70. A mixer 74 may receive an output of the analog gain control 72 as an input and adjust (i.e., shift) the frequency of the signal to a suitable frequency for the channel the signal will be transmitted on. The mixer 74 may additionally or alternatively perform frequency modulation (FM) or amplitude modulation (AM) to modify the frequency or amplitude of the signal, respectively. The output of the mixer 74 may then feed into an input of the power amplifier 76 for amplification to an output signal 78 suitable for transmission across a channel.

Further, in some embodiments, to control the gain of the power amplifier 76, envelope tracking techniques may be used. That is, the gain of the power amplifier 76 may respond to changes in a smooth curve tracking the crests and/or troughs of the amplitude (i.e., envelope) of the input signal 52. In such embodiments, an envelope path 57, which may include an envelope shaping block 58, an envelope tracking DAC 64, an envelope modulator 66, or any suitable combination of these components may be used to track the envelope of the input signal 52 and modulate the supply voltage to the power amplifier 76 based on shape of the input signal's 52 envelope. That is, the supply voltage input to the power amplifier 76 may vary depending on the envelope of the input signal 52. As such, the gain of the power amplifier 76 may also vary depending on the envelope of the input signal 52, as the gain of the power amplifier 76 may depend, in part, on the supply voltage of the power amplifier 76.

In some embodiments, the envelope shaping block 58 may receive the output of the DPD block 56 as an input signal, determine the amplitude of the input signal 52, and output a digital signal corresponding to a supply voltage or change in supply voltage that may suitably control the gain of the power amplifier 76. To do so, the envelope shaping block 58 may include a set of LUTs (i.e., 60 and 62) that may map the input signal 52 to the appropriate digital signal output by the envelope shaping block 58. The envelope tracking DAC 64 may convert the digital signal supplied by the envelope shaping block 58 to an analog voltage signal that an envelope modulator 66 may receive. The envelope modulator 66 may receive the analog voltage signal from the envelope tracking DAC 64 and may feed a suitable supply voltage into the power amplifier 76 based in part on the analog signal and the envelope tracking of the input signal 52.

Further, in some embodiments, the behavior of the envelope shaping block 58 may depend on the operation mode of the transmitter 50. That is, in certain operation modes of the transmitter 50, certain gain and/or efficiency characteristics from the power amplifier 76 may be desirable, while in other operation modes of the transmitter 50, different gain and/or efficiency characteristics from the power amplifier 76 may be desirable. Thus, in some embodiments, each LUT in the set of LUTs (i.e., 60 and 62) may correspond to an operation mode of the transmitter 50. For example, a first LUT 60 may correspond to the normal operation mode of the transmitter 50, and a second LUT 62 may correspond to the ULCA mode of the transmitter 50. During the normal operation mode, the first LUT 60 may receive the input signal 52 and/or the signal output by the DPD block 56 and determine a suitable supply voltage to feed into the power amplifier 76 to enable constant compression and increased efficiency characteristics of the power amplifier 76 during the generation of output signal 78. In some embodiments, during the ULCA mode of the transmitter 50, the second LUT 62 may receive the input signal 52 and/or the same signal output by DPD block 56 and may determine a different suitable supply voltage to feed into the power amplifier 76 to enable iso-gain at the power amplifier 76. In some embodiments, the transceiver 28 may send a signal to the transmitter 50 from the processor 12 to specify the mode of operation to be used so that the correct LUT is selected from the set of LUTS (i.e., 60 and 62) to enable the correct power amplifier 76 behavior.

The illustrated embodiment of the envelope shaping block 58 includes a set of LUTs (i.e., 60 and 62). However, it should be appreciated that in some embodiments the LUTs 60 and 62 may not be stored in the envelope shaping block 58; rather, the LUTs 60 and 62 may be stored in non-volatile memory and loaded into the envelope shaping block 58 before they are used. Further, while two LUTs (i.e., 60 and 62) are illustrated, any suitable number of LUTs may be used. In some embodiments, for example, a single LUT may be used across every operation mode of the transmitter 50. In such embodiments, for example, the LUT may include data for each operation mode of the transmitter 50 organized into different sections within the table that may each map to a respective operation mode.

Figure 8A:
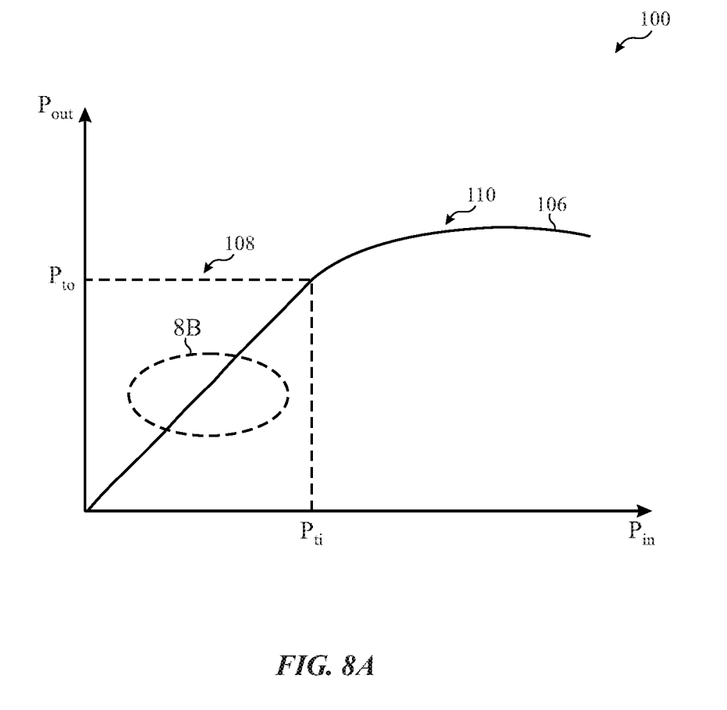
FIG. 8A is an embodiment of a plot of the transfer function of the power amplifier of FIG. 7.

To facilitate discussion of the gain characteristics of the power amplifier 76, FIG. 8A illustrates a plot 100 of a power amplifier's 76 input power (i.e., Pin) along a horizontal axis 104 versus its output power (i.e., Pout) along a vertical axis 102 for a given supply voltage. The slope of the curve 106 represents the gain of the power amplifier $$\left(i.e., \ \frac{Pin}{Pout}\right).$$

The curve 106 may represent the transfer function of an actual power amplifier 76. As such, the curve 106 includes a linear region 108 and a non-linear (or compression) region 110, while the transfer function of an ideal power amplifier may only include a linear region 108. In the linear region 108, the slope of the curve 106 is generally linear, and as such, the gain of the power amplifier 76 may be relatively constant (i.e., iso-gain). That is, the power amplifier 76 may apply the same gain to each input power level within the linear region 108 (i.e., up until the input power level Pti) to generate an output power level. The input power level Pti may represent the input power level at which the curve 106 transitions from the linear region 108 to the non-linear region 110. The output power level Pto may represent the corresponding output level for the point on the curve 106 marking the transition between regions. As such, the power amplifier 76 may apply variable gain to power input levels greater than Pti. The non-linear region 110 may approach a constant value, or saturate, so that the output powers may remain generally the same for input power levels falling in the constant region. Further, in the non-linear region 110, the gain of the power amplifier 76 may be applied in constant compression. That is, the gain applied to the power input may decrease as the power input level increases.

During normal mode, constant compression applied by the power amplifier may be suitable to transmit a single broadband signal with high efficiency. As such, in some embodiments, the first LUT 60 may be loaded with a set of high supply voltages that may cause the power amplifier 76 to suitably apply variable gain from the non-linear region 110 of its transfer function to each power input level.

In the case of the ULCA mode, constant gain applied by the power amplifier 76 may be suitable to meet the ACLR benchmarks set by the 3GPP and limit distortion in the transmitted signal. In this mode, the standards set by 3GPP specify a maximum power reduction level that may be used to back off (i.e., reduce) the maximum signal power of a power amplifier 76 based on its configuration in an uplink carrier aggregation system. By reducing the maximum power of the power amplifier 76, the output of the power amplifier 76 may fall in the linear region 108 of its transfer function. Thus, relatively constant gain may be applied to the signal transmitted in ULCA mode.

Figure 8B:
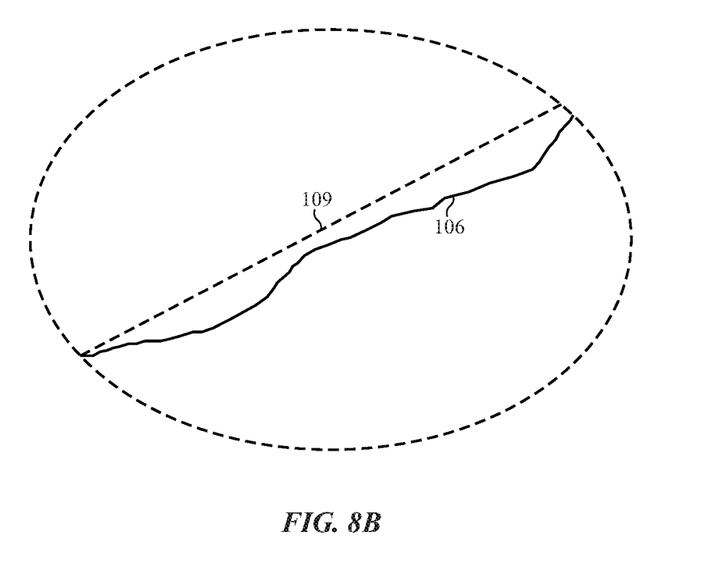
FIG. 8B is another embodiment of the plot of the transfer function of the power amplifier of FIG. 7.

However, the linear region 108 of an actual power amplifier 76 may be generally, but not completely linear, as the close-up plot within the linear region 108 in FIG. 8B better illustrates. As such, the power amplifier 76 may apply less than constant gain. Further, during ULCA mode the non-linearity of the linear region 108 may not suitably reduce the transmitted signal's vulnerability to distortion nor meet the ACLR benchmarks set forth by the 3GPP. Thus, in addition to maintaining the power amplifier's 76 operation within the linear region by reducing its maximum power, the transmitter 50 may dynamically adjust the supply voltage of the power amplifier 76 to produce a more linear power amplifier 76 transfer function.

Turning now to FIG. 8B, a close-up view of the curve 106 within the linear region 108 alongside a reference linear curve 109 demonstrates the non-linarites of the transfer function of the power amplifier 76. The reference linear curve 109 represents the transfer function of an ideal power amplifier and may represent the desired shape of the actual power amplifier's 76 transfer function in order for it to apply constant gain. Thus, in some embodiments, the transmitter 50 may use envelope tracking and second LUT 62 to dynamically adjust the supply voltage of the power amplifier 76 so that each point on curve 106 is shifted onto the reference linear curve 109. That is, the transmitter 50 may shift the power output levels corresponding to each power input level by suitably adjusting the supply voltage of the power amplifier 76 to apply constant gain.

Figure 9:
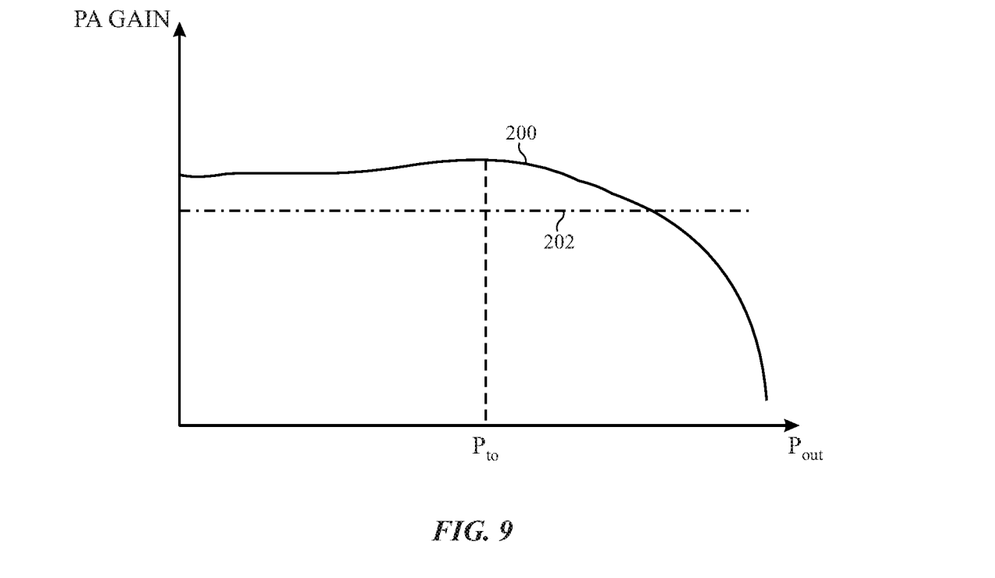
FIG. 9 is a plot of the gain of the power amplifier of FIG. 7.

With the adjustments to the supply voltage of the power amplifier 76, a more constant gain may be applied to a signal by the power amplifier. Accordingly, FIG. 9 provides context of a variable gain curve 200 that may be applied by an actual power amplifier 76 alongside an iso-gain curve 202. The power output level Pto corresponds to the same Pto marking the transition from the linear region 108 to the non-linear region 110 in FIG. 8A. Accordingly, beyond power output level Pto, the variable gain curve 200 may have negative slope, demonstrating gain compression at high power output levels. Further, the gain of the actual power amplifier 76 is generally constant leading up to the power output level Pto. Though, as a result of the non-linarites in the transfer function of the actual power amplifier 46, as discussed above, the slope of the variable gain curve 200 does not exactly match the slope of the iso-gain curve 202. In some embodiments, however, by adjusting the supply voltages of the power amplifier 76 according to the second LUT 62, the gain of the power amplifier 76 may become constant. That is, the variable gain curve 200 may be adjusted to match the shape of iso-gain curve 202.

Figure 10:
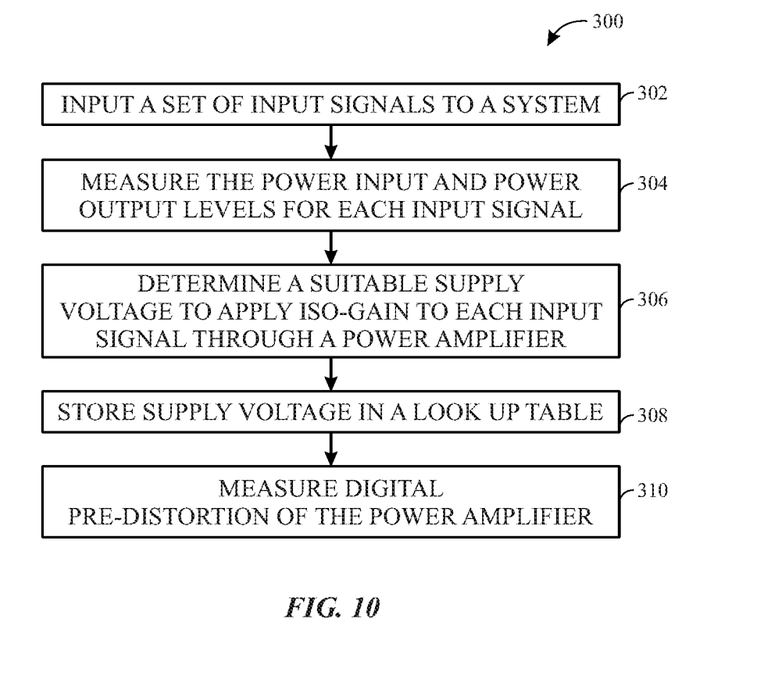
FIG. 10 is a block diagram of a method to calibrate the transceiver of FIG. 1, in accordance with an embodiment.
Figure 11:
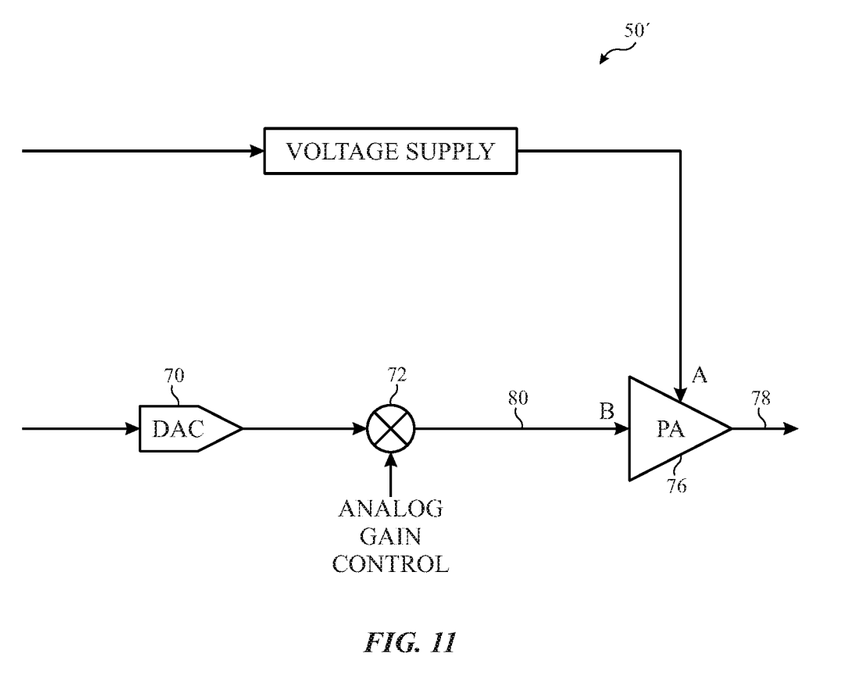
FIG. 11 is another embodiment of the transceiver of FIG. 1.

With the foregoing in mind, FIG. 10 illustrates a flow chart of a method 300 for calibrating suitable supply voltage values into the second LUT 62 to apply constant gain at the power amplifier 76 during ULCA mode, in accordance with embodiments described herein. The method 300 may be used to calibrate the second LUT 62 when the transmitter 50 is built, reset, reconfigured, and/or in any other suitable scenarios. Further, although the description of the method 300 is described in a particular order, which represents a particular embodiment, it should be noted that the method 300 may be performed in any suitable order, and steps may be added or omitted. Additionally, FIG. 11 provides a simplified embodiment of a transmitter 50' to better facilitate discussion of the calibration involved in the method 300.

Accordingly, in an embodiment, to calibrate the values of the second LUT 62, at block 302 of the method 300, a set of input signals are input into a system. In the illustrated embodiment of FIG. 11, the system is represented as a simplified transmitter 50'. As such, the input signals may include a set of voltages input to the DAC 70 to be converted to analog signals. The analog gain control 72 may apply analog gain to the analog signals before inputting them to the power amplifier 76. Because the exact relationship of the input power level, supply voltage, and output power level (i.e., gain) of the power amplifier 76 may vary from one power amplifier to another due to imperfections and limitations in their materials and manufacturing, calibrating the second LUT 62 based on measurements of gain may not be efficient. As such, at block 304, measurements of power input levels and power output levels may be taken for the set of input signals at an input 80 and the output 78 of the power amplifier 76, respectively. When the power amplifier 76 is operating with iso-gain, the difference between two power input levels ($\Delta Pin$) will match the difference between the two power output levels ($\Delta Pout$) corresponding to each of the power input levels (i.e., $\Delta Pin = \Delta Pout$). That is, because the gain applied by the power amplifier 76 may be measured in decibels (dB) (i.e., on a logarithmic scale), the gain adds or subtracts into the power input level to generate the power output level. As such, a constant gain term would be removed from power outlet levels subtracted from one another, leaving a difference term ($\Delta Pout$) that matches the difference between the corresponding power input levels (i.e., $\Delta Pin = \Delta Pout$). At block 306, a suitable supply voltage to enable the power amplifier 76 to apply iso-gain may be determined. To do so, in an embodiment, a voltage supply 82 (i.e., voltage generator) may be used to adjust the supply voltage of the power amplifier 76 until the conditions of iso-gain are met, as discussed above. The voltage supply 82 may adjust the supply voltage for each input signal in the set of input signals so that the power amplifier 76 may operate with constant gain across all of the input signals. Further, in some embodiments, points may be interpolated between and/or extrapolated from the set of supply voltages to expand the set for a broader set of input signals. The resulting set of supply voltages may linearize the transfer function of the power amplifier 76 when used with their corresponding power input levels. Accordingly, at block 308, the supply voltages may be stored into the second LUT 62 so that they are ready to be used in envelope tracking of the input signal 52. To check the linearity of the transfer function of the power amplifier 76 after the second LUT 62 has been calibrated, at block 310, the digital pre-distortion of the power amplifier 76 may be measured. If the digital pre-distortion is linear, the transfer function of the power amplifier 76 may be linear, and the power amplifier 76 may apply constant gain. Otherwise, additional fine tuning of the supply voltages may correct non-linearity in the transfer function.

The specific embodiments described above have been shown by way of example, and it should be understood that these embodiments may be susceptible to various modifications and alternative forms. It should be further understood that the claims are not intended to be limited to the particular forms disclosed, but rather to cover all modifications, equivalents, and alternatives falling within the spirit and scope of this disclosure.

The techniques presented and claimed herein are referenced and applied to material objects and concrete examples of a practical nature that demonstrably improve the present technical field and, as such, are not abstract, intangible or purely theoretical. Further, if any claims appended to the end of this specification contain one or more elements designated as "means for [perform]ing [a function] . . . " or "step for [perform]ing [a function] . . . ", it is intended that such elements are to be interpreted under 35 U.S.C. 112(f). However, for any claims containing elements designated in any other manner, it is intended that such elements are not to be interpreted under 35 U.S.C.

What is claimed is:

1. A transmitter, comprising:
   a power amplifier configured to receive an input signal and amplify the input signal based on a transfer function characterizing the power amplifier; and
   a control circuit operably coupled to the power amplifier, wherein the control circuit is configured to cause the power amplifier to generate an output signal while tracking an envelope of the input signal at least in part by:
      applying a first set of variable supply voltages to the power amplifier to operate the power amplifier in a non-linear region of the transfer function; and
      applying a second set of variable supply voltages to the power amplifier to operate the power amplifier in a linear region of the transfer function, wherein the second set of variable supply voltages vary over time to adjust the linear region of the transfer function to be more linear.

2. The transmitter of claim 1, wherein applying the first set of variable supply voltages corresponds to a normal operation mode, and wherein applying the second set of variable supply voltages corresponds to an uplink carrier aggregation mode.

3. The transmitter of claim 2, wherein, in the uplink carrier aggregation mode, the output signal comprises two to five baseband signals aggregated into a single baseband signal, wherein a total frequency of the two to five baseband signals is 100 (megahertz) MHz.

4. The transmitter of claim 1, wherein the control circuit is configured to generate the first set of variable supply voltages, the second set of variable supply voltages, or both based in part on an envelope of an unprocessed signal in the transmitter, wherein the power amplifier is configured to generate the output signal based in part on the first set of variable supply voltages, the second set of variable supply voltages, or both.

5. The transmitter of claim 4, wherein the control circuit comprises:
   an envelope shaping circuit having a first look up table corresponding to a first mode of operation and a second look up table corresponding to a second mode of operation, the envelope shaping circuit being configured to:
      receive the unprocessed signal;
      in the first mode of operation, generate an unprocessed supply signal based in part on an envelope of the unprocessed signal and the first look up table; and
      in the second mode of operation, generate the unprocessed supply signal based in part on the envelope of the unprocessed signal and the second look up table;
   an envelope tracking digital-to-analog converter (DAC) operably coupled to the envelope shaping circuit, the envelope tracking DAC being configured to convert the unprocessed supply signal to an analog signal; and
   an envelope modulator circuit operably coupled to the envelope tracking DAC, the envelope modulator circuit being configured to receive the analog signal and configured to generate the first set of variable supply voltages or the second set of variable supply voltages.

6. The transmitter of claim 4, wherein the control circuit comprises:
   a first look up table corresponding to a first mode of operation, the first look up table having a first mapping of data representative of the envelope to data representative of the first set of variable supply voltages; and
   a second look up table corresponding to a second mode of operation, the second look up table having a second mapping of the data representative of the envelope to the data representative of the second set of variable supply voltages.

7. The transmitter of claim 6, wherein, in the second mode of operation, the control circuit is configured to cause the power amplifier to generate the output signal by applying the constant gain to the input signal based at least in part on the second mapping of the data representative of the envelope to the data representative of the second set of variable supply voltages.

8. The transmitter of claim 1, wherein the transmitter is configured to receive an unprocessed input signal and configured to generate the input signal based in part on the unprocessed input signal.

9. The transmitter of claim 8, comprising a digital predistortion circuit configured to introduce distortion to the unprocessed input signal to generate a distorted signal, wherein the distortion offsets distortion generated by the power amplifier.

10. The transmitter of claim 9, comprising a digital-to-analog converter (DAC) configured to convert the distorted signal from a digital signal to an analog signal to generate a distorted analog signal.

11. A method of operating a power amplifier of a transmitter having a normal operation mode and an uplink carrier aggregation mode to perform envelope tracking, comprising:
   receiving an input signal at the power amplifier;
   in the uplink carrier aggregation mode, generating an output signal having an iso-gain relative to the input signal by applying a first set of variable supply voltages to the power amplifier to adjust a linear portion of a transfer function of the power amplifier to be more linear; and
   in the normal operation mode, generating the output signal having a variable gain relative to the input signal by applying a second set of variable supply voltages to the power amplifier to operate the power amplifier in a non-linear region of the transfer function.

12. The method of claim 11, comprising:
   in the uplink carrier aggregation mode:
      receiving a supply signal at the power amplifier, wherein the supply signal is based in part on an envelope of the input signal; and
      generating, via the power amplifier, the output signal based in part on the supply signal and the input signal.

13. The method of claim 11, comprising:
   in the uplink carrier aggregation mode:
      generating, via the power amplifier, the output signal based in part on contents of a first look up table; and
   in the normal operation mode:
      generating, via the power amplifier, the output signal based in part on contents of a second look up table.

14. The method of claim 11, wherein, in the uplink carrier aggregation mode, the output signal comprises a plurality of baseband signals, wherein each of the plurality of baseband signals comprise a frequency of 1.4 MHz, 3 MHz, 5 MHz, 10 MHz, or 20 MHz.

15. The transmitter of claim 1, wherein the control circuit is configured to calibrate the power amplifier at least in part by:
- generating, via the power amplifier, a first output signal based on a first input signal and a supply signal;
- generating, via the power amplifier, a second output signal based on a second input signal and the supply signal;
- measuring a first change in power between a power level corresponding to the first input signal and a power level corresponding to the second input signal;
- measuring a second change in power between a power level corresponding to the first output signal and a power level corresponding to the second output signal; and
- adjusting the supply signal so that the first change in power corresponds to the second change in power.

16. The transmitter of claim 1, wherein the control circuit is configured to be operated in a second mode of operation to apply the second set of variable supply voltages to the power amplifier.

* * * * *